United States Patent
Baumgartner et al.

(10) Patent No.: US 7,421,669 B2
(45) Date of Patent: Sep. 2, 2008

(54) USING CONSTRAINTS IN DESIGN VERIFICATION

(75) Inventors: Jason Raymond Baumgartner, Austin, TX (US); Hari Mony, Austin, TX (US); Viresh Paruthi, Austin, TX (US); Jiazhao Xu, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 11/236,451

(22) Filed: Sep. 27, 2005

(65) Prior Publication Data
US 2007/0074136 A1    Mar. 29, 2007

(51) Int. Cl.
G06F 9/45 (2006.01)
G06F 17/50 (2006.01)

(52) U.S. Cl. ............................................. 716/5; 716/7
(58) Field of Classification Search .................... 716/4, 716/5, 7; 703/19
See application file for complete search history.

(56) References Cited

U.S. PATENT DOCUMENTS

| | | | |
|---|---|---|---|
| 6,698,003 B2 | 2/2004 | Baumgartner et al. | |
| 7,020,856 B2 * | 3/2006 | Singhal et al. | 716/4 |
| 7,028,279 B2 * | 4/2006 | Jain et al. | 716/5 |
| 7,039,883 B2 * | 5/2006 | Krishnamurthy | 716/3 |
| 2004/0107409 A1 * | 6/2004 | Melham et al. | 716/5 |
| 2004/0123254 A1 * | 6/2004 | Geist et al. | 716/4 |
| 2005/0043935 A1 * | 2/2005 | Dreschsler et al. | 703/13 |

OTHER PUBLICATIONS

"Abstraction Refinement by Controllability and Cooperativeness Analysis", by Freddy Y.C. mang and Pei-Hsin Ho, ACM, @ Jun. 7, 2004.*

* cited by examiner

*Primary Examiner*—Paul Dinh
*Assistant Examiner*—Nha T Nguyen
(74) *Attorney, Agent, or Firm*—Casimer K. Salys; Dillon & Yudell LLP

(57) ABSTRACT

A method for generating a constraint for use in the verification of an integrated circuit design includes identifying a target in a netlist (N) of the design and creating an overapproximate abstraction (N') of the netlist. A space state (S') is created by enumerating the states of N' from which the identified target may be asserted. A constraint space C' is then derived from the state space S', where C' is the logical complement of S'. The process is repeated for multiple selected targets and the constraint spaces from each iteration are logically ANDed. Creating an overapproximate abstraction may include replacing a sequential gate with a random gate. Identifying a sequential gate may include selecting a target in the netlist, performing underapproximate verification of the target, and, if a spurious failure occurs, selecting a gate further down the fanin chain of the currently selected gate.

5 Claims, 5 Drawing Sheets

```
gate SYNTHESIZE(BDD node) {
    if(node == BDD-ZERO) {return GATE_ZERO;}
    if(node == BDD_ONE) {return GATE_ONE;
    invert = BDD_IS_INVERTED(node);
    node = BDD_CLEAR_INVERTED(node);
    gate = Synthesized(node);

if(!gate) {
    gate = IF_THEN_ELSE(node correlating to BDD_VARID(node), // "if" clause
        SYNTHESIZE(BDD_THEN(node)),   //"then" clause
        SYNTHESIZE(BDD_ELSE(node)));  // "else" clause
```

600

USING CONSTRAINTS IN DESIGN VERIFICATION

BACKGROUND

1. Field of the Present Invention

The present invention is in the field of integrated circuit design and, more particularly, verifying the design of an integrated circuit prior to fabrication.

2. History of Related Art

In the field of integrated circuit design, formal verification refers to the process of rigorously proving that a design satisfies its specification. Typically, the specification of a verification problem includes a netlist-based representation of the design and a set of expected values for specified nets. As an example, a verification problem may include determining whether a state exists in which a CHECKSTOP signal is asserted, where an asserted CHECKSTOP signal indicates a fault. Using formal verification, one either finds a counterexample trace depicting a sequence of values of the nets over time, similar to a simulation trace, that leads to an assertion of the CHECKSTOP signal or proves that no such trace exists.

Formal verification is often performed using state space search algorithms. Such algorithms include unbounded and bounded exhaustive searches. Bounded exhaustive searches try to find an assertion of CHECKSTOP that can occur within N time steps from an initial state of the design. Unbounded exhaustive algorithms increase N until no states are encountered that have not already been encountered for smaller values of N (a condition termed "fixed-point"). If no path from an initial state to a violating state (a state in which CHECKSTOP is asserted) is encountered before fixed-point is reached, then correctness can be inferred.

The number of verification cycles required to perform an exhaustive state space search increases exponentially with the number of state holding elements or registers. This exponential relationship makes formal verification impractical for designs containing a very large number of state holding elements. As a result, semiformal verification have been employed as a verification technique suitable for large designs. Semiformal verification leverages formal algorithms by applying them to larger designees only in a resource-bounded manner. Semiformal verification, however, achieves only partial verification coverage. It would be desirable to implement a verification technique that facilitated the more complete verification coverage achievable with formal verification methods while addressing the resources limitations encountered when using formal verification.

SUMMARY OF THE INVENTION

The stated objective is facilitated by a method for generating a constraint for use in the verification of an integrated circuit design that includes identifying a target in a netlist (N) of the design and creating an overapproximate abstraction (N') of the netlist. A space state (S') is created by enumerating the states of N' from which the identified target may be asserted. A constraint space C' is then derived from the state space S', where C' is the logical complement of S'. The process may be repeated for multiple targets in which case the constraint spaces from each iteration are logically ANDed. Creating an over-approximate abstraction may include replacing a sequential gate with a random gate. Identifying a sequential gate may include selecting a target in the netlist, performing underapproximate verification of the target, and, if a spurious failure occurs, selecting a gate further down the fanin chain of the currently selected gate.

BRIEF DESCRIPTION OF THE DRAWINGS

Other objects and advantages of the invention will become apparent upon reading the following detailed description and upon reference to the accompanying drawings in which.

Figure 1:
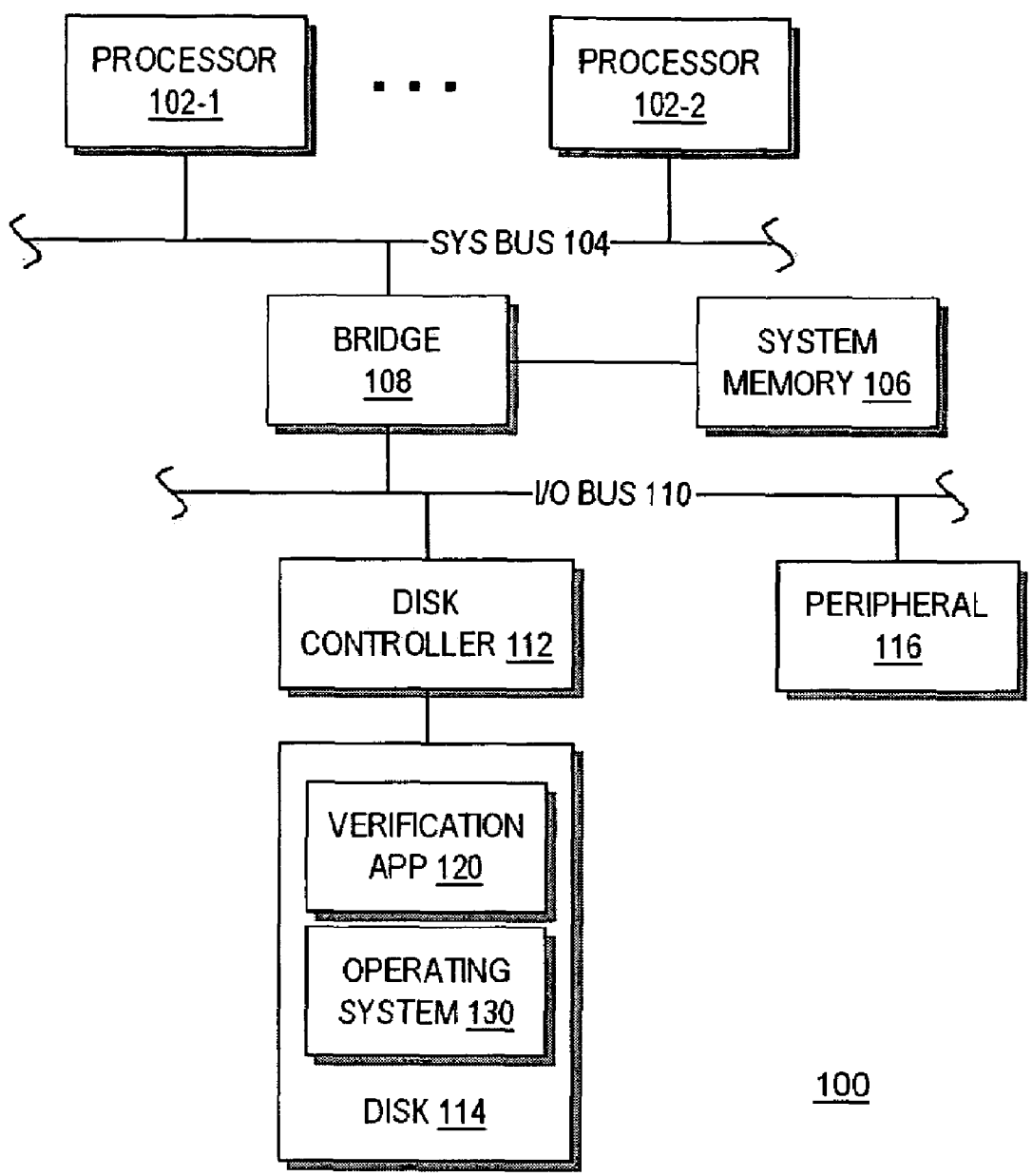
FIG. 1 is a block diagram of selected elements of a data processing system suitable for implementing a constraint-based design verification application according to an embodiment of the invention.

While the invention is susceptible to various modifications and alternative forms, the drawings show specific embodiments of the invention that this disclosure will describe in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF AN EMBODIMENT OF THE INVENTION

A method for identifying verification constraints for use in design verification is described. Verification constraints are constructs used in design verification applications. A verification constraint is a specially-labeled gate in a netlist or other model of a design. As suggested by its name, a verification constraint represents a limitation on the freedom of the verification toolset to explore the state space of the design. More specifically, a verification constraint prevents the verification application from exploring any "j" time-step trace in which any of one or more constraints evaluate to "0" during any of the "j" time steps. An illustrative example of a constraint follows: "if the design of a particular circuit includes a buffer and the buffer is full, then the inputs of the design are constrained to prevent new transfers of data."

Verification constraints define a portion of a design's state space that is of no concern for verification purposes and would, therefore, consume scarce verification resources unnecessarily if it were verified. Referring to the buffer-full example from the preceding paragraph, constraining the design's inputs to prohibit data transfers when the buffer is full means that the verification toolset need not and will not cover states that represent the design accepting new data transfers when the buffer is full. Although it may be interesting to observe how the design operates under conditions that are not permitted, it is more efficient for design verification purposes simply to verify that the design does in fact prohibit data transfers when the buffer is full and then to eliminate from consideration all those states within the space defined by the constraint.

In the absence of a verification constraint, a typical verification problem is stated as: "find a 'j' step trace exhibiting a violation of a property, or prove that no such trace exists for any 'j'." With a verification constraint, the same verification problem becomes: "find a 'j' step trace that (1) exhibits a violation of a property and (2) does not exhibit a "0" value for any constraint in any of the 'j' steps, or prove that no such trace exists for any 'j'." Because verification constraints alter the. semantics of a verification problem, they have the potential to cause a property that could be reached to become unreachable. It is important, therefore, to select constraints appropriately. Specifically, constraints must not alter the semantics of the verification problem. A constraint, for example, that would prevent the verification toolset from discovering a valid assertion of a CHECKSTOP is not permitted. The verification constraint implementation described herein is concerned with an efficient and accurate method for deriving constraints that can then be applied to the design.

Because constraints prohibit the exploration of certain otherwise reachable states, redundancy removal algorithms may leverage constrains to enable greater merging. In particular, redundancy removal algorithms may merge gates that are equivalent in "all states reachable along paths that do not violate any constraints" even if they are not equivalent in some states that are reachable only after violating a constraint. This simplification may yield dramatic improvements to the verification process.

The verification system and method operate on a model of an integrated circuit design. The model illustrated in this disclosure is a netlist that includes gates and edges. Edges represent interconnections between gates so that, for example, an edge connects a source gate to a sink gate. In the embodiment of concern in this disclosure, a gate falls into one of four broad functional categories, namely, constant gates, random gates, combinational gates, and sequential gates. A constant gate produces a logical level that does not vary with time. A random gate, also referred to as a primary input, may assume any logical level in any time step independent of all other gates. A combinational gate is a logical element such as an AND gate. A sequential gate is also known to as a register gate or simply a register. A register has two components associated with it, namely, an initial value function, and a next state function. The value of a register for time 0 is the value of the initial value function at time 0 while the value of a register at time "i+1" is equal to the value of its next state function at time "i."

In some embodiments, the invention is implemented as a data processing system having design verification functionality. Referring to FIG. 1, selected elements of a data processing system 100 suitable for discovering verification constraints according to the present invention (as described below with respect to FIG. 2 through FIG. 6) is depicted. In the depicted embodiment, system 100 includes general purpose processors 102-1 and 102-2 (generically or collectively referred to herein as processor(s) 102). The number of processors is implementation specific and other embodiments may have more or fewer processors 102.

Processors 102 share access to a high-speed system bus 104. A bus bridge 108 provides an interface between system bus 104 and a shared peripheral bus 110. Bus bridge 108 as depicted in FIG. 1 also includes memory control functionality and provides an interface between system bus 104 and a system memory 106. System memory 106 is most likely a volatile storage medium such as a relatively large array of DRAM elements. Peripheral bus 110 may be implemented as an industry standard peripheral bus such as a PCI (peripheral components interface) or PCI-X bus.

A disk controller 112 connected to peripheral bus 110 provides an interface to a hard disk 114. Disk 114 may store data and instructions used by processors 102. In the depicted embodiment, the instructions stored on disk 114 include an operating system 130 and a verification application 120 according to the present invention. Operating system 130 may be a commercially distributed operating system such as a Unix-based operating system, a Linux operating system, or a Windows® family operating system from Microsoft Corporation. The depicted embodiment of system 100 may include one or more additional peripheral devices represented by peripheral 116. Peripheral 116 may represent a network communication device (e.g., a network interface card) coupling system 100 to a network, a graphics adapter providing graphic display capabilities to system 100, or a number of other well known peripheral devices.

As suggested in the preceding paragraph, verification application 120 may be implemented as a set or sequence of computer executable instructions, stored on a computer readable medium, for verifying that a design meets its specification. The instructions may be stored on a persistent storage medium such as hard disk 114, a CD ROM (not depicted), floppy diskette (not depicted), magnetic tape (not depicted), and the like. The instructions may also be stored on a volatile storage medium such as system memory 106 or a cache memory (not depicted) of data processing system 100.

Figure 2:
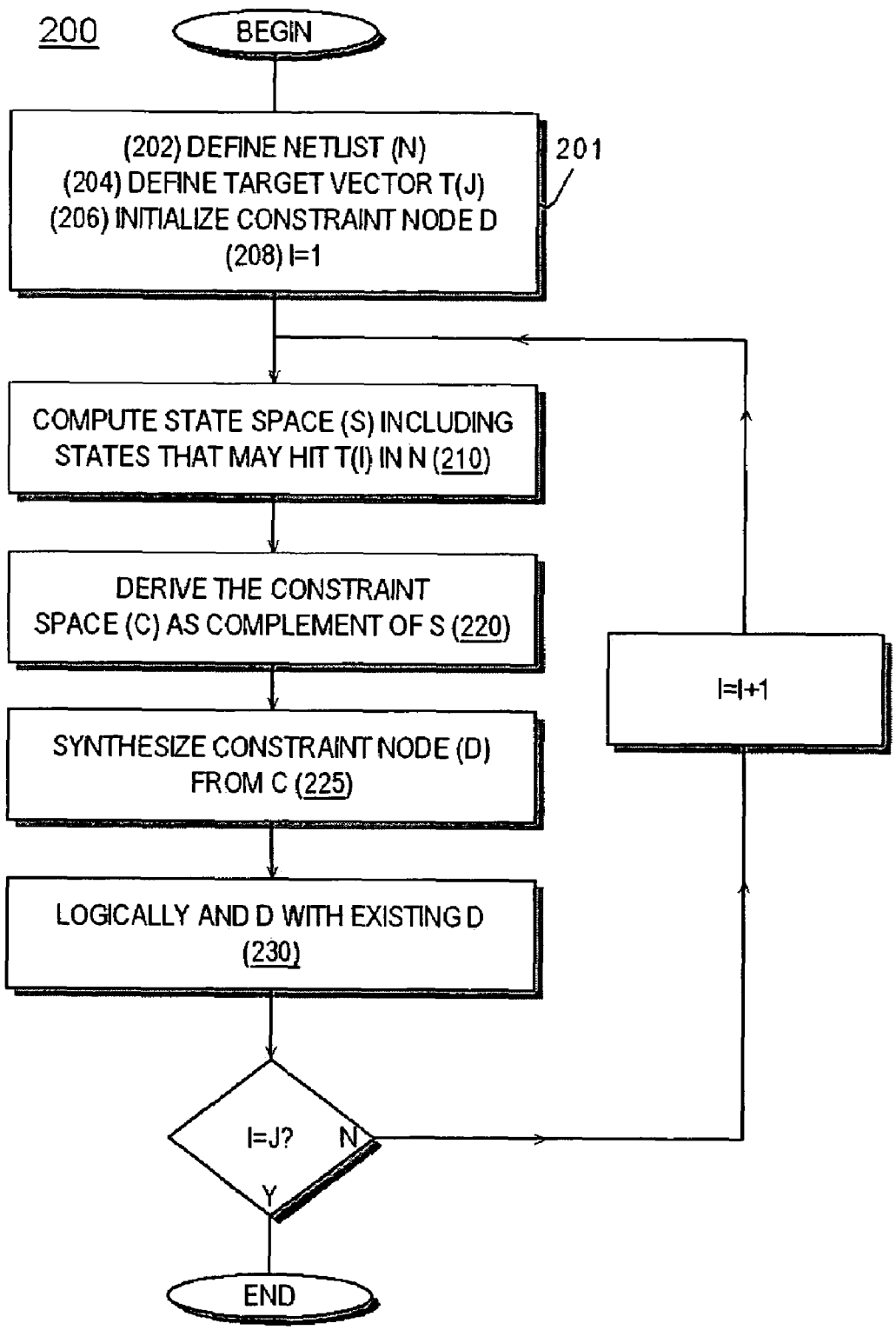
FIG. 2 is a flow diagram of selected elements of a method for generating design verification constraints according to an embodiment of the present invention.

Turning now to FIG. 2, a flow diagram depicts a computerized method 200 of discovering verification constraints that can applied in the verification of a particular design. In the depicted embodiment, method 200 includes an initialization block 201 that includes defining (202) a netlist (N) for a design. As described above, one type of netlist describes a circuit or other design in terms of gates and edges where gates include constant gates, random gates, combinational gates, and sequential gates and the edges represent interconnections between gates. After defining the netlist N, a target vector T(J) is defined (204). Target vector T(J) includes J targets $t_1$ through $t_J$ where J is an integer greater than 0 and each target is a specially labeled gate within the design. Targets are gates that equate or correlate to properties of the design that are of interest. A constraint node (D) is declared (206) and initialized. Constraint node D represents a synthesis of the set of states in which none of the verification targets $t_1$ through $t_J$ are asserted. Conceptually, method 200 determines the constraint space, which is a set of states in which none of the targets is asserted. Method 200 then synthesizes that constraint space into a corresponding constraint node D and appends constraint node D to the design's netlist. In one embodiment, constraints limit the stimulus that can be applied to the design by enforcing adherence to a rule that the constraint node D must evaluate to "1" for every time step. If constraint node D assumes a "0" value during any time step, the corresponding trace is halted.

Method 200 also includes initializing (208) a counter I to 1. Method 200 will execute its core loop once for every target t in the target vector T(J) and I is used to track the iteration count.

After the declaration and initialization is completed, method 200 begins the process of determining appropriate constraints for the design. Method 200 as depicted in FIG. 2 determines (block 210) the set of states that do not assert the current target (i.e., $t_1$) by first computing (block 210) the state space S for netlist N where S includes states in which or from which the design may assert the current target. This determination is preferably achieved using preimage computation. Preimage computation is a process of determining all states that may assert the current target $t_J$ by first determining all that states that hit $t_J$ in 0 time steps, 1 time step, 2 time steps, and so forth. Because there are $2^R$ possible states where R is the number of sequential gates in the design, it may, in theory, require $2^R$ time steps to fully enumerate all of the states in which the current target is asserted. In practice, however, it may require far fewer time steps to determine that no new states are being encountered, at which point the preimage computation process may terminate.

After determining the state space S in block 210, method 200 includes deriving (block 220) a constraint space C that represents the logical complement of S. The resulting constraint node D is then derived or synthesized (block 225) from constraint space C and logically ANDed (block 230) to the existing constraint node. The sequence of blocks 210 through 230 is repeated for each target t in the target vector T(J) so that the resulting constraint node D represents the set of states that may never hit any of the targets. Because method 200 discovers all states of a design that may never hit any of the targets, method 200 may be thought of as a formal constraint generation process.

As a formal constraint generation process, method 200 determines a constraint gate that is maximally constraining without altering the semantics of the verification problem. Unfortunately, while the process of determining the theoretically maximal set of constraints is optimal for purposes of applying constraints to the design, the process of enumerating the exact set of states that may hit t in N is not computationally feasible for designs of any significant complexity. Moreover, computing all possible preimages of a target is effectively equivalent to solving the target and thereby eliminates the need to apply the constraints, since the purpose of the constraints is to simplify the processor of solving the target. In one embodiment, the constraint determination process described herein addresses these practical limitations on formal constraint determination.

Figure 3:
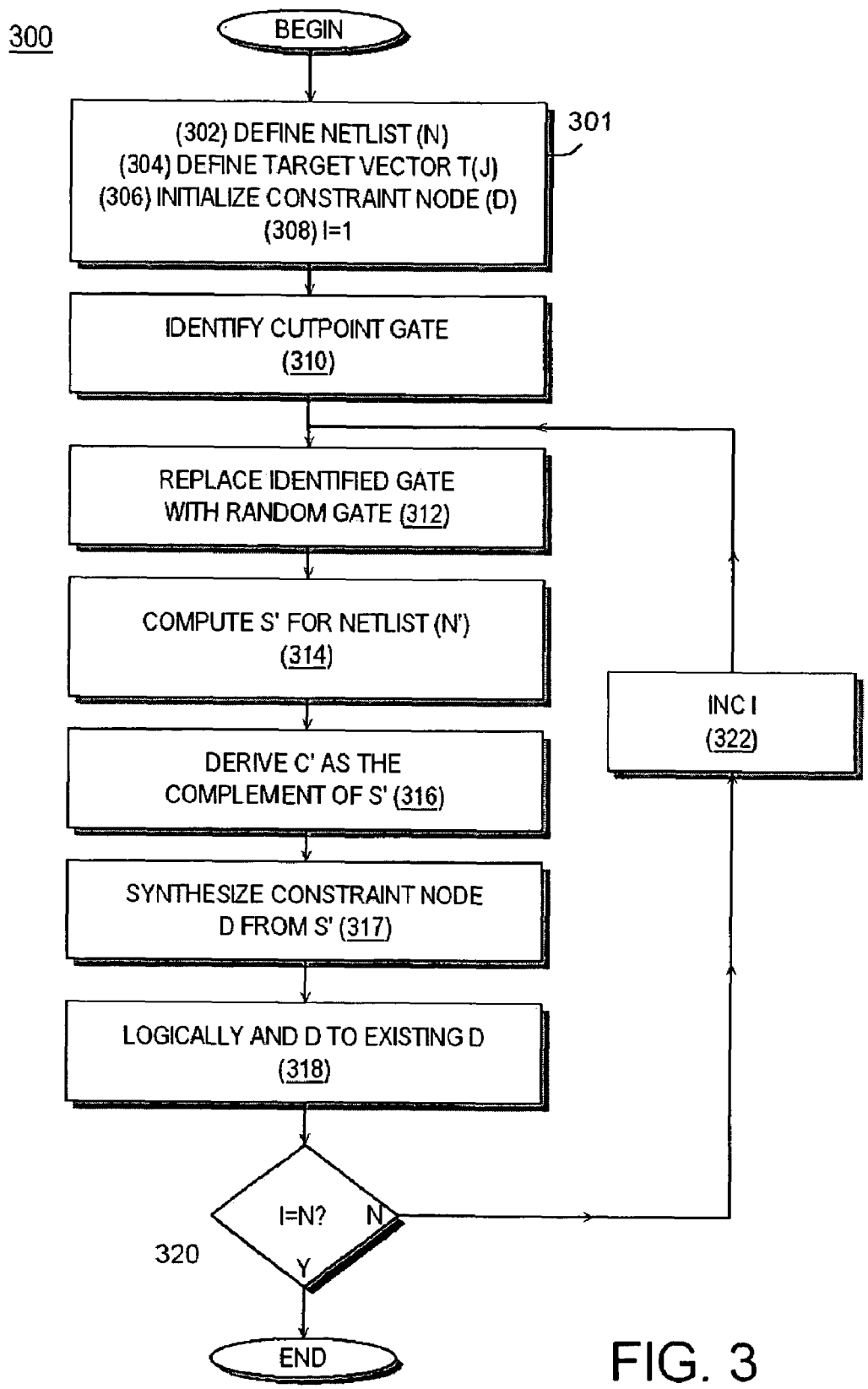
FIG. 3 is a flow diagram of selected elements of a method for generating design verification constraints according to an embodiment of the invention emphasizing the use of an over approximate abstraction of the design's netlist.

Referring now to FIG. 3, a method 300 of determining a verification constraint using an abstraction of the netlist according to one embodiment is depicted in flow diagram format. In the depicted embodiment, method 300 includes an initialization block 301 that includes defining (302) a netlist N, defining (304) a target vector T(J), initializing (306) a constraint node D, and initializing (308) a counter. These blocks are substantially analogous to blocks 202 through 208 respectively of method 200 depicted in FIG. 2.

In method 300 as depicted in FIG. 3, however, one or more cutpoint gates are then identified (block 310). The method of identifying appropriate cutpoint gates is implementation specific. One implementation is described in greater detail below with respect to FIG. 4. After identifying a cutpoint gate, a cutpoint is introduced into the netlist N to create an abstraction of N, referred to herein as N'. A cutpoint gate is introduced by replacing (block 312) a sequential gate G in netlist N with a random gate G'. The output of the random gate G' drives the same inputs in the abstraction netlist N' as the sequential gate G drives in N. Unlike the inputs of gate G in netlist N, however, the inputs of G', are random inputs that are not connected to any other elements of the network N'.

The inputs to random gate G' can assume any value on any gate cycle regardless of the other stimulus that are applied to the design. As such, the net effect of introducing cutpoints into a netlist is to over-approximate the behavior of the design, because the random gate G' can simulate the behavior of the original gate while the converse is not necessarily true. As an overapproximate model of the netlist N, the preimages based on the netlist abstraction N' may include states that from which the target t could not be asserted in N.

Thus, the set of states S' associated with the netlist abstraction N' becomes larger than it would be without the abstraction. Consequently, the inverse of S', the abstraction constraint space C', is smaller than it would be without the abstraction. Although the abstraction state space S' is larger than the corresponding, the preimage computation may be less complex for the abstraction netlist N' because much of the logic associated with the original netlist N may fall out of the cone of influence of the targets. Because the state space associated with C' is a subset of the state space associated with C, C' is still safe in the sense that it does not alter the semantics of the verification problem. C' will not, however, be as constraining as C, but performing a preimage computation on C' is easier.

The generation of an abstraction constraint space thus represents a tradeoff between the extent of the constraint and the time and computing power required to identify the constraint. In other words, the abstraction state space represents a trade off between the computational efficiency of the constraint generation and the resulting constraint. Accordingly, method 300 as depicted in FIG. 3 includes computing (block 314) S' for the abstraction netlist N' and deriving (block 316) C' as the complement of S'. After deriving C', the constraint node D corresponding to C' is synthesized (block 317) and logically ANDed to the existing constraint node D so that node D is a cumulative node representing the constraint spaces of all targets.

Figures 4, 6:
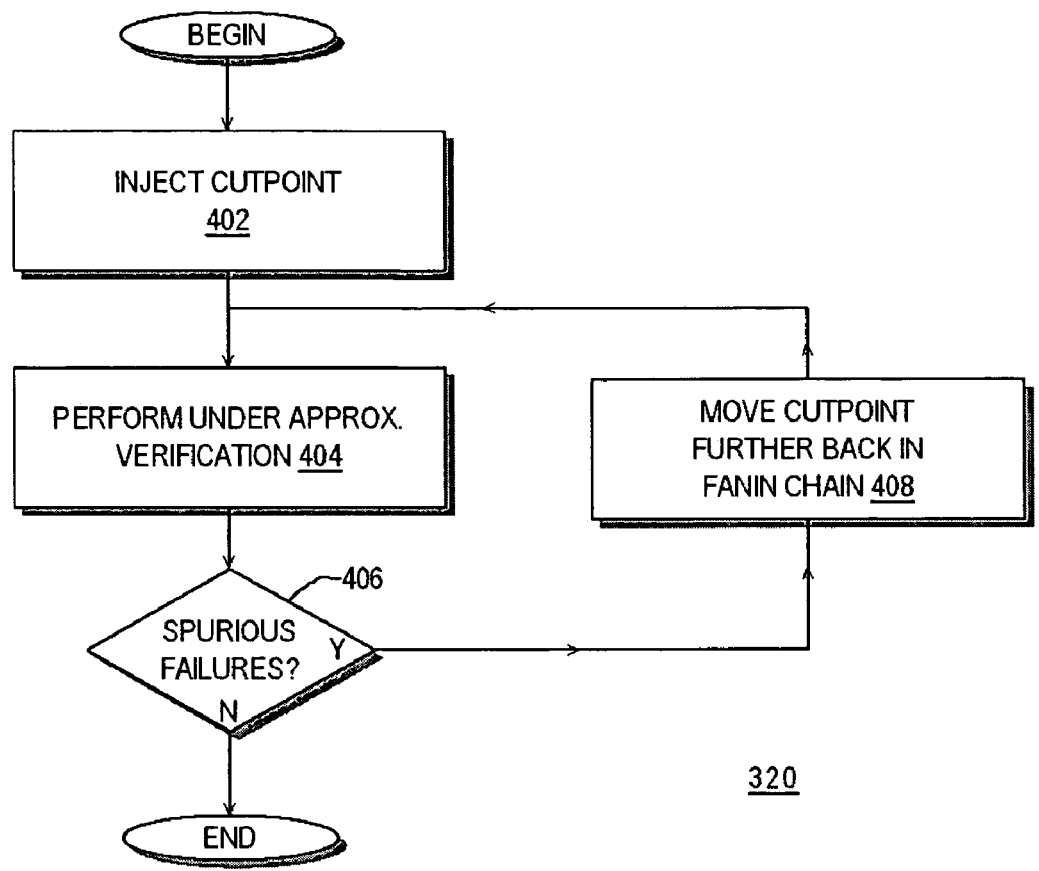
FIG. 4 is a flow diagram illustrating details of a method for identifying the cutpoints as depicted in FIG. 3 according to one embodiment.
FIG. 6 is code for synthesizing a constraint node to be used in the netlist according to an embodiment of the present invention.

The method of inserting cutpoints to create an abstraction pursuant to block 310 of FIG. 3 is implementation specific. One implementation uses semantic analysis to choose gates for which selection does not significantly alter the resulting S'. Portions of such a "local refinement" technique are described in Clarke et al., *Counterexample-guided Abstraction Refinement* Int'l Conf. on Computer Aided Verification (2000). As depicted in FIG. 4, block 310 includes running one or more simulation traces or some other under approximate verification (block 404). The results of the verification efforts in block 404 are then evaluated in block 406 to determine the presence of spurious failures. In this context, a spurious failure is a failure, such as the assertion of a CHECKSTOP, that would not occur except for the insertion of the cutpoint under consideration.

If the selected cutpoint does cause spurious failures, the cutpoint is then refined by moving (block 408) the cutpoint further back in the fanin chain of the existing cutpoint gate. Moving the cutpoint up the fanin chain will eventually cause the target under consideration to behave as it behaves in the original verification model. Somewhere between the original cutpoint and a cutpoint that is all the way up the fanin chain, a cutpoint may be found that eliminates the spurious failure while still enabling some simplification of the circuit. It is this gate that may then be used for the cutpoint.

Figure 5:
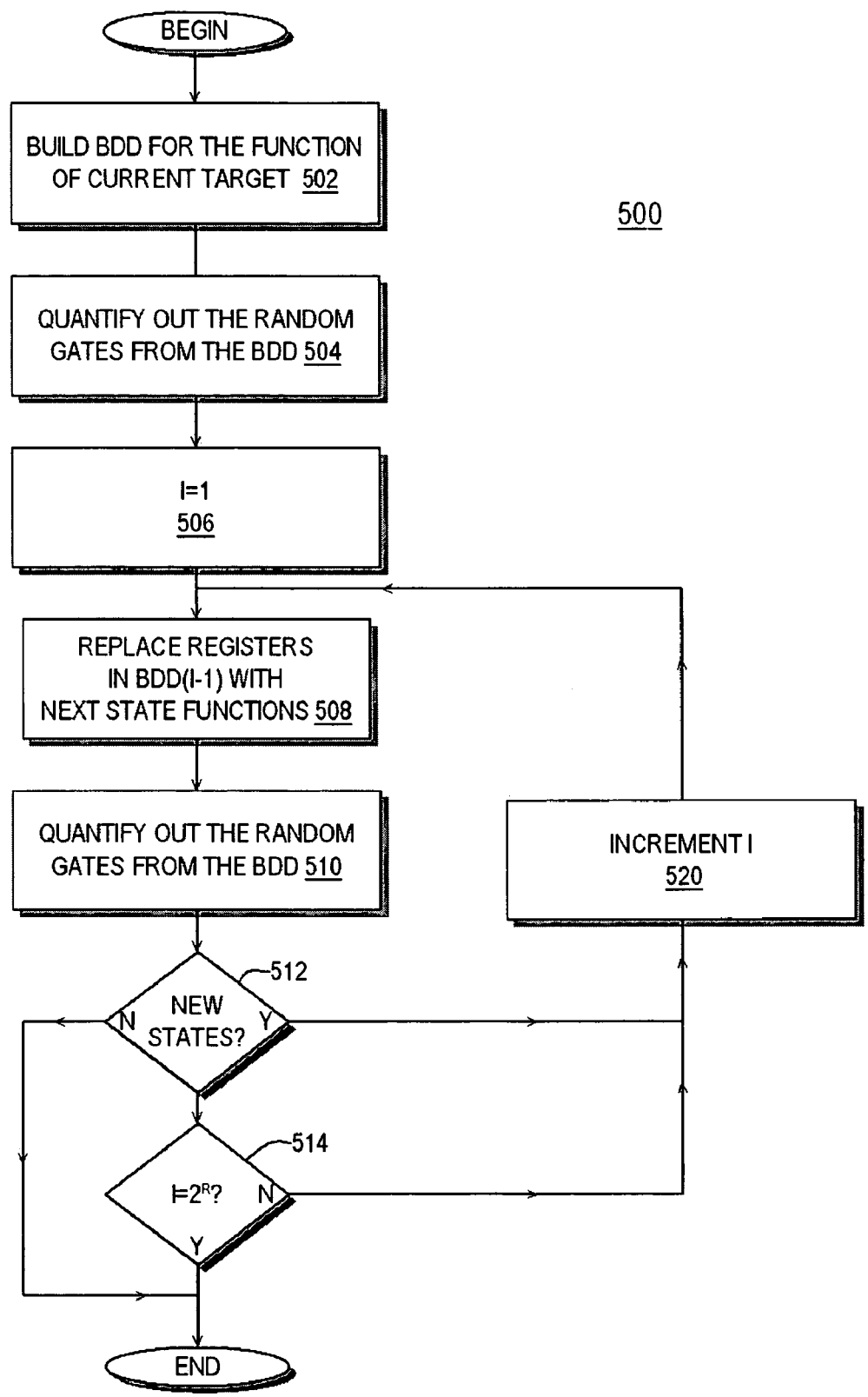
FIG. 5 is a flow diagram illustrating details of a method for identifying the state space of states from which a selected target can be asserted.

One embodiment of a method 500 for performing the preimage computation of block 314 of FIG. 3 is depicted by the flow diagram of FIG. 5. Method 500 uses preimage computation to compute the set of states from which the target may be hit. Preimage computation includes enumerating the set of states that can hit the target in 0 steps, the set of states that can hit the target in 1 step, the set of states that can hit the target in 2 steps, and so forth. The embodiment depicted in FIG. 5 is based on binary decision diagrams (BDDs). A BDD is data structure that represents a Boolean function.

As depicted in FIG. 5, method 500 includes determining the 0-th step preimage by first building (block 502) a BDD for the function of the target under consideration. The BDD is a combinational function over registers and random gates. The random gates are then removed from the BDD using existential quantification in block 504. Existential quantification is the predication of a property or relation to at least one member of a domain and is commonly used in design verification applications to process random gates in verification algorithms.

After constructing the BDD for the 0 time step, method 500 initializes a counter (block 506) and begins a looping sequence in which the i-th preimage is determined by substituting (block 508) the next state functions for corresponding registers in the support for the BDD of the previous preimage (i.e., the (i-1) th preimage). The random gates are then existentially quantified out of the preimage in block 510. This sequence of blocks 508 and 510, with the counter being incremented (block 520) in each loop until either there are no new states encountered which were not encountered in previous steps (block 512) or the number of preimages equals the number of possible states (i.e., $2^R$ where R is the number of state holding elements) according to block 514.

The method of synthesizing the constraint space into a format suitable for inclusion in the netlist is also implementation specific. Referring to FIG. 6, code suitable for synthesizing the constraints in a BDD-based preimage computation embodiment is depicted. Synthesis of the constraints modifies the netlist with a new constraint that may then be subjected to verification. The new constraint may enhance verification in multiple ways. For example, simulation and semi-formal verification need not waste resources exploring states where the constraint is violated. More significantly, one may use the constraints to simplify the netlist. Two gates that are redundant in all states that may be reached without violating the constraint may be merged—even if they differ in states reachable without constraint. In this manner, the constraints may be leveraged by a redundancy removal process. The resulting simplified netlist may often be substantially easier to verify, both for finding bugs in the design, as well as completing proofs of correctness.

It will be apparent to those skilled in the art having the benefit of this disclosure that the present invention contemplates a mechanism for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method for generating a constraint for use in the verification of an integrated circuit design, comprising:

identifying a target in a netlist representation (N) of the integrated circuit design, wherein the netlist representation N includes sequential gates, random gates, or combinational logic; wherein said target is a vector including multiple target gates;

Initializing a constraint node and appending the constraint node to N, creating an over-approximate abstraction (N') of the netlist representation N by modifying the netlist representation N through replacement of a sequential gate in N with a random gate;

computing a space state S' of N' including enumerating the states of N' from which it is possible to assert the identified target, wherein said enumerating includes:

enumeration a first set of states that can hit the target in 0 time steps by building a binary decision diagram (BDD) for a function of the target and quantifying out random gates;

enumerating a second set of states that can hit the target in "i" time steps by substituting a next state function for a corresponding register in a BDD of the function of the target in an "i-1" time step and then quantifying out the random gates;

deriving a constraint space C' from the state space S', wherein C' is the complement of S'; and synthesizing a constraint from constraint space C' and applying said constraint to said integrated circuit design.

2. The method of claim 1, further comprising, repeating said creating, computing and deriving steps for each of a plurality of targets in said target vector.

3. The method of claim 2, wherein said synthesizing a constraint from constraint space C' and applying said constraint to said integrated circuit design comprises, synthesizing a constraint node (D) from the constraint space C' and logically ANDing the constraint node D to a first constraint node.

4. The method of claim 1, and further comprising identifying the sequential gate, wherein identifying the sequential gate includes:

selecting said target in the netlist representation N;

performing under-approximate verification of the selected target;

responsive to detecting a spurious failure, refining a gate of the selected target, and repeating performance of the under-approximate verification of the selected target.

5. The method of claim 4, wherein refining the gate comprises selecting a gate further down a fanin chain of the gate of the selected target and replacing the selected gate with a random gate.

* * * * *